(12) United States Patent
Lee (10) Patent No.: US 6,984,302 B2
(45) Date of Patent: Jan. 10, 2006

(54) ELECTROPLATING CELL BASED UPON ROTATIONAL PLATING SOLUTION FLOW

(75) Inventor: Kevin J. Lee, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 36 days.

(21) Appl. No.: 09/223,472

(22) Filed: Dec. 30, 1998

(65) Prior Publication Data

US 2002/0000383 A1 Jan. 3, 2002

(51) Int. Cl.
C25D 5/08 (2006.01)
C25D 21/10 (2006.01)

(52) U.S. Cl. .................. 205/133; 204/275.1; 205/123; 205/148; 427/421.1

(58) Field of Classification Search ............. 205/133, 205/122, 123, 148; 204/237, 275, 242, 275.1; 427/248.1, 240, 241, 421.1
See application file for complete search history.

(56) References Cited

U.S. PATENT DOCUMENTS

| | | | |
|---|---|---|---|
| 4,151,062 A * | 4/1979 | Norris .......................... 204/273 |
| 4,304,641 A | 12/1981 | Grandia et al. |
| 4,339,319 A | 7/1982 | Aigo |
| 4,443,304 A * | 4/1984 | Eidschun ...................... 204/27 |
| 4,906,341 A | 3/1990 | Yamakawa et al. |
| 4,981,559 A * | 1/1991 | Sato et al. .................. 204/14.1 |
| 5,000,827 A | 3/1991 | Schuster et al. |
| 5,391,285 A | 2/1995 | Lytle et al. |
| 5,443,707 A * | 8/1995 | Mori ........................... 204/242 |
| 5,626,913 A * | 5/1997 | Tomoeda et al. ........... 427/299 |
| 5,830,334 A * | 11/1998 | Kobayashi ............... 204/224 R |
| 5,911,619 A * | 6/1999 | Uzoh et al. .................... 451/5 |
| 6,001,235 A * | 12/1999 | Arken et al. ................. 205/137 |
| 6,042,712 A | 3/2000 | Mathieu ...................... 205/209 |

OTHER PUBLICATIONS

R. Byron Bird, et al, "Transport Phenomena," 1960, pp. 219-220, Department of Chemical Engineering, University of Wisconsin, Madison, Wisconsin, John Wiley & Sons.

* cited by examiner

Primary Examiner—Roy King
Assistant Examiner—William T. Leader
(74) Attorney, Agent, or Firm—Blakely, Sokoloff, Taylor & Zafman LLP (57) ABSTRACT

The invention discloses a method of electroplating a material onto a semiconductor substrate. A substrate is placed in a cylindrical processing chamber enclosure. A nozzle for spraying a liquid electroplating solution opposes the top surface of the substrate. The electroplating solution flows through the nozzle and outward angularly from the tip of the nozzle, so that the solution flows rotationally on the surface of the substrate.

15 Claims, 4 Drawing Sheets

ELECTROPLATING CELL BASED UPON ROTATIONAL PLATING SOLUTION FLOW

FIELD OF THE INVENTION

This invention is in the field of semiconductor processing. More specifically, the invention discloses a method for electroplating a material onto a semiconductor substrate.

BACKGROUND OF THE INVENTION

A step in the fabrication of semiconductor integrated circuits is to apply a thin film of material onto the surface of a semiconductor substrate. The thin film is then patterned to form openings within the film. A second thin film of material is applied to the patterned thin film such that the second thin film fills the openings of the pattern in the first film. The second thin film is then patterned, and a third thin film is applied to the second thin film and is patterned, and the sequence is repeated until the desired integrated circuit structure is created.

The sequence for building an integrated circuit begins with a transistor structure formed on the semiconductor substrate. Alternating layers of electrically conducting and insulating thin film materials are formed over the transistor structure, and the electrically conducting film layers are interconnected to one another to form electrically conducting pathways throughout the integrated circuit. The conducting film material is commonly aluminum or an alloy of aluminum. Vapor deposition is the preferred method for applying the conducting film to the surface of the substrate.

As technology advances toward faster speeds for integrated circuits, the widths of individual lines of the circuitry decrease in size. Although vapor deposition continues to be widely used for depositing films, new methods such as electroplating are being developed for depositing conductor films within tight spacings in a patterned film layer. Additionally, it becomes necessary to use conductors with reduced resistance such as copper due to speed limitations posed by aluminum and alloys of aluminum.

A viable technique for forming a copper thin film layer on a patterned substrate surface is electroplating. A patterned semiconductor substrate is prepared for electroplating. The patterned film on the semiconductor substrate may be an insulating film such as silicon dioxide. The patterned silicon dioxide contains openings to the underlying conductor film material. The underlying conductor film material may be copper or it may be another conductor material. To prepare for electroplating, a seed layer of material may be formed on the underlying conductor film material using vapor deposition.

Once prepared with the necessary seed layer, if any, the patterned semiconductor substrate is placed face down at the top end of an electroplating cup. A cathode contact is created on the edge of the substrate by coupling the substrate to the negative terminal of a power source. There is an anode at the bottom of the electroplating cup. The anode is coupled to the positive terminal of a power source. The substrate is clamped against an O-ring to form a watertight seal around the substrate perimeter. An inlet pipe is inserted into the cup through the bottom of the cup, so that a nozzle at the end of the pipe is inside the cup and faces the substrate surface. A liquid electroplating solution flows through the inlet pipe and out of the nozzle, spraying a liquid jet of fluid directed perpendicularly toward the substrate surface. The electroplating solution contacts the substrate surface, the power supply is turned on, and a circuit is formed between the anode and cathode through the electroplating solution. The desired material is electroplated onto the surface of the substrate.

One aspect of making electroplating a viable process for semiconductor fabrication is to form a uniformly deposited electroplated film layer. Utilizing the standard technique described above, film thickness uniformities of 6% can be achieved. However, for achieving desired process yields an even better uniformity is needed. Moreover, as the substrate size increases from 200 millimeters in diameter to 300 millimeters and beyond, it will be more difficult to attain electroplated film thickness uniformity using the currently known electroplating techniques. There are several factors causing non-uniformity in electroplating. One of the factors is lack of continuity of the cathode contact. This can be corrected by utilizing a cathodic contact ring at the edge of the substrate to form a continuous cathode contact. Another factor causing non-uniform electroplated film thickness is an accumulation of electrolytic solution on surface points on the substrate due to the perpendicular transport of liquid to the substrate surface.

A way of improving electroplated film thickness uniformity was identified in U.S. Pat. No. 4,304,641 "Rotary Electroplating Cell with Controlled Current Distribution". There the method was to use a flow-through jet plate having nozzles of increasing size and uniformly spaced radially therethrough or the same sized nozzles with varying radial spacing to provide a differential flow distribution of the plating solution. Additionally, the patent disclosed the technique of rotating the substrate by connecting the cathode to a spindle, which in turn is rotated by a motor. Alternatively, the cathode and anode can be rotated at the same time. Rotating the substrate relative to the anode helps to create a more uniform distribution of electroplating solution over the surface of the substrate by preventing accumulation on contact from the liquid spray.

One problem with using a jet plate is that a jet plate must be specially fabricated with exact hole distribution and dimensions. This can significantly add to the cost of fabricating the electroplating equipment. A problem with rotating the cathode and possibly the anode, of course, is the increased complexity of the equipment. Whenever there are moving parts in equipment, equipment maintenance becomes more complex and chances of mechanical failure are greater. Using a motor in the equipment drives the cost of the equipment up. Higher costs are desirably avoided because of the generally increasing costs of producing integrated circuits while prices of manufactured integrated circuit parts continue to decrease.

It is therefore advantageous to use an electroplating technique that can improve the film thickness uniformity while at the same time avoiding increased cost and complexity to the electroplating equipment.

SUMMARY OF THE INVENTION

The present invention discloses a method of applying a liquid material onto a substrate surface. The liquid material is applied by placing the substrate surface within an enclosure, and introducing the liquid material into the enclosure. The liquid material is directed angularly toward the substrate surface so that the liquid material flows rotationally upon contact with the substrate surface.

In conjunction with the method, there is also described an apparatus for coating a substrate with a liquid material. There is a chamber having cylindrical interior walls, where the chamber has a first end and an opposing second end. An opening in the first end holds the substrate. An inlet pipe having an end that is directed within the chamber is coupled to the second end of the chamber. A nozzle is coupled to the end of the inlet pipe, through which the liquid material is sprayed generally toward the substrate surface, wherein the liquid material flows rotationally upon contact with the substrate.

BRIEF DESCRIPTION OF THE DRAWINGS

The drawings are provided to enable the reader to help understand the workings of the invention through example only, and are not set forth as visual limitations of the present invention. The drawings are described briefly as.

DESCRIPTION OF THE PREFERRED EMBODIMENTS

The present invention provides a technique for coating a substrate with a liquid material in such a way that the liquid material forms a coating with acceptable thickness uniformity across the substrate while avoiding the use of rotary or other mechanical motion to create a rotational liquid material flow. The invention is useful for electroplating or for other manufacturing processes where a liquid is applied to a substrate surface. The inventive method includes directing the liquid material angularly toward the substrate surface. The invention will be described in more detail below. To facilitate a description, the context for description is set forth in the field of semiconductor manufacturing, more specifically an electrochemical cell for electroplating metal, in particular, copper, on a semiconductor substrate. Any reference to "approximate" dimensions should be construed as the designated dimension plus or minus variation within tolerances that would be reasonable according to the judgment of a person of ordinary skill in the art, in the context of using a given embodiment of the invention.

Figure 1A:
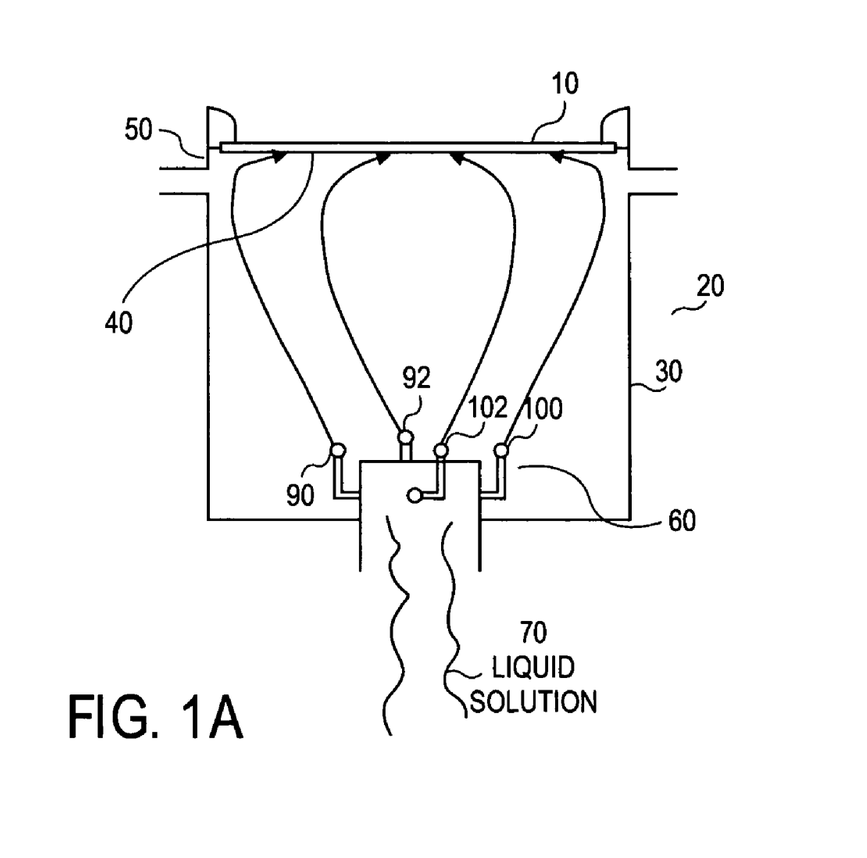
FIG. 1A is a cross-sectional view of a substrate held in an enclosure with a liquid spraying onto the substrate.

Referring to FIG. 1A, there is provided a substrate 10 within an enclosure 20. Enclosure 20 contains cylindrical walls 30. Substrate 10 is a semiconductor wafer with a surface 40 containing a pattern (pattern not shown). Substrate 10 is secured to the top end 50 of enclosure 20. Substrate surface 40 faces a nozzle 60. Nozzle 60 directs liquid solution 70 out of nozzle 60 toward surface 40. Nozzle 60 contains four spray outlets 90, 92, 100, 102 which direct liquid 70 at an angle from perpendicular. The resulting flow of liquid 70 on surface 40 is a rotational pattern.

Figure 1B:
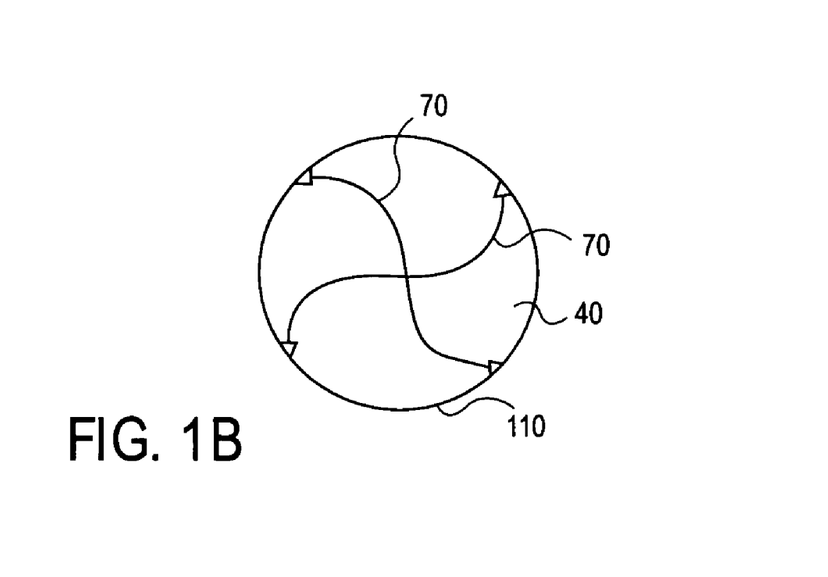
FIG. 1B is a top view of the substrate surface, representing lines of liquid flow as the liquid contacts the substrate surface.

FIG. 1B sketches the theoretical shape of liquid 70 as it flows on surface 40. Flow lines are shown to extend in a curve and radially outward toward the perimeter 110 of surface 40.

Figure 1C:
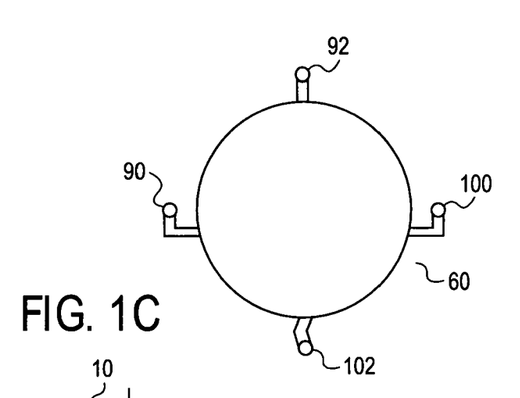
FIG. 1C is a top view of the nozzle through which liquid spray emanates.

FIG. 1C is a top view of nozzle 60 containing four spray outlets 90, 92, 100, 102 where each pair of spray outlets 90, 92, 100, 102 are at opposite sides of a cross shape. Each spray outlet 90, 92, 100, 102 sprays liquid out of nozzle 60 in the general direction of substrate 10 (FIG. 1A).

Figure 1D:
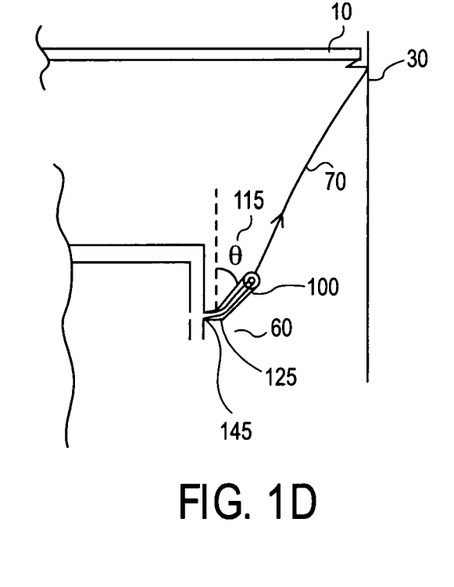
FIG. 1D is a side view of a single liquid spray outlet to demonstrate an angle θ by which the liquid may be sprayed.

FIG. 1D is a side view of nozzle 60 with spray outlet 100 emanating therefrom. Spray outlet 100 is preferably a cylindrical pipe having an elbow joint 125 and a shoulder joint 145. Spray outlet 100 is angled away from vertical by angle θ 115. Angle θ is preferably in a range of 20 to 60 degrees from vertical. Nozzle 60 is held in the vertical direction. Angle θ 115 can be formed by bending elbow joint 125 outward radially away from nozzle 60. Spray outlet 100 is attached to nozzle 60 at the shoulder joint 145. Shoulder joint 145 is held at an approximately 90-degree angle with respect to the vertically-shown nozzle 60.

Figure 1E:
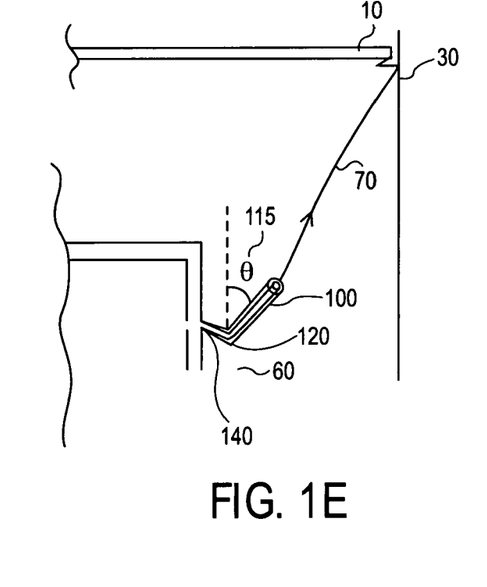
FIG. 1E is a side view of a single liquid spray outlet to demonstrate an alternative way of achieving the angle θ shown in FIG. 1D.

Alternatively, FIG. 1E is a side view of nozzle 60 containing one spray outlet 100. Spray outlet 100 is angled outward from nozzle 60 in a similar radial angular direction θ 115 as in FIG. 1D. Although the angle shown herein is about 45 degrees, the angle is preferably in a range of approximately 20 to 60 degrees from vertical. Nozzle 60 is held in the vertical direction. Spray outlet 100 is preferably a cylindrical pipe having an elbow joint 120 and a shoulder joint 140. Elbow joint 120 is shown here to be angled at approximately 90 degrees. Instead of bending spray outlet 100 outward by angling the elbow joint as in FIG. 1D, angle θ 115 is formed by angling shoulder joint 140 relative to nozzle 60. Liquid flow 70 emanating from elbow joint 125, 120 in either FIGS. 1D or 1E is directed radially outward from nozzle 60, so that liquid contacts cylindrical walls 30 of enclosure 20 (FIG. 1A). When in contact with cylindrical walls 30, liquid flow 70 rotates according to the shape of cylindrical walls 30.

Figure 1F:
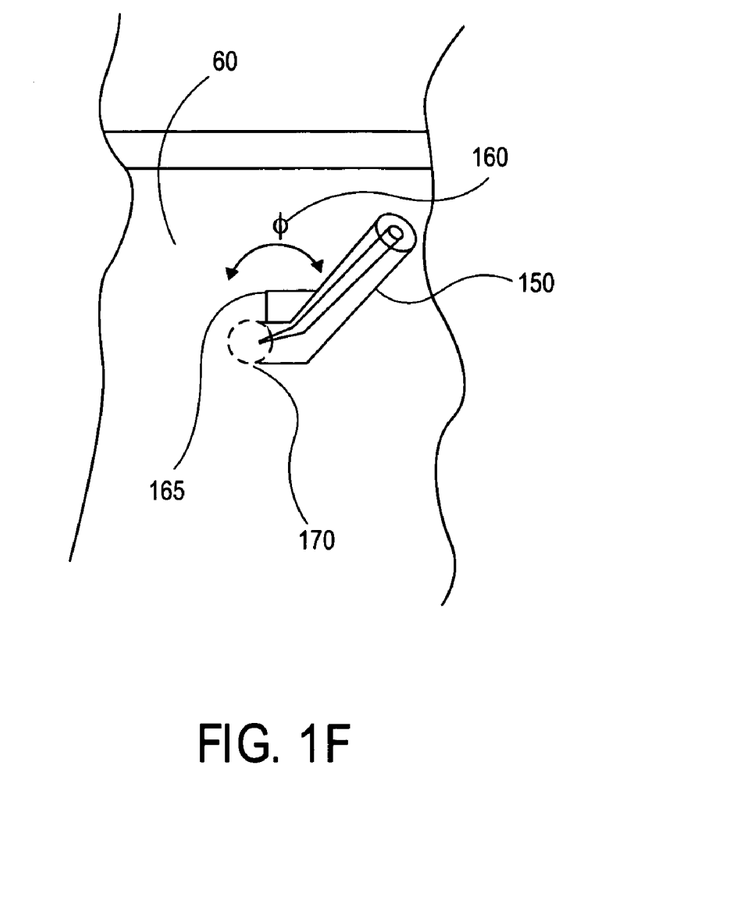
FIG. 1F is a side view of a single liquid spray outlet to demonstrate an alternative angle φ by which the liquid may be sprayed.

Still alternatively, as shown in FIG. 1F, spray outlet 150 is shown to be angled at approximately 45 degrees from vertical, in an angular direction φ160. Preferably, angular direction φ is directed such that liquid spray emanates from spray outlet 150 at approximately 20 to 60 degrees from vertical. However, unlike FIGS. 1D and 1E, angular direction φ is formed by twisting spray outlet 150 at shoulder joint 170. Elbow joint 165 and shoulder joint are both at approximately 90 degrees. Spray outlet 150 is therefore angled sideways if one is facing nozzle 60 and spray outlet 150. Liquid spray emanating from spray outlet 150 would thus be directed circumferentially toward the substrate surface.

Figure 2:
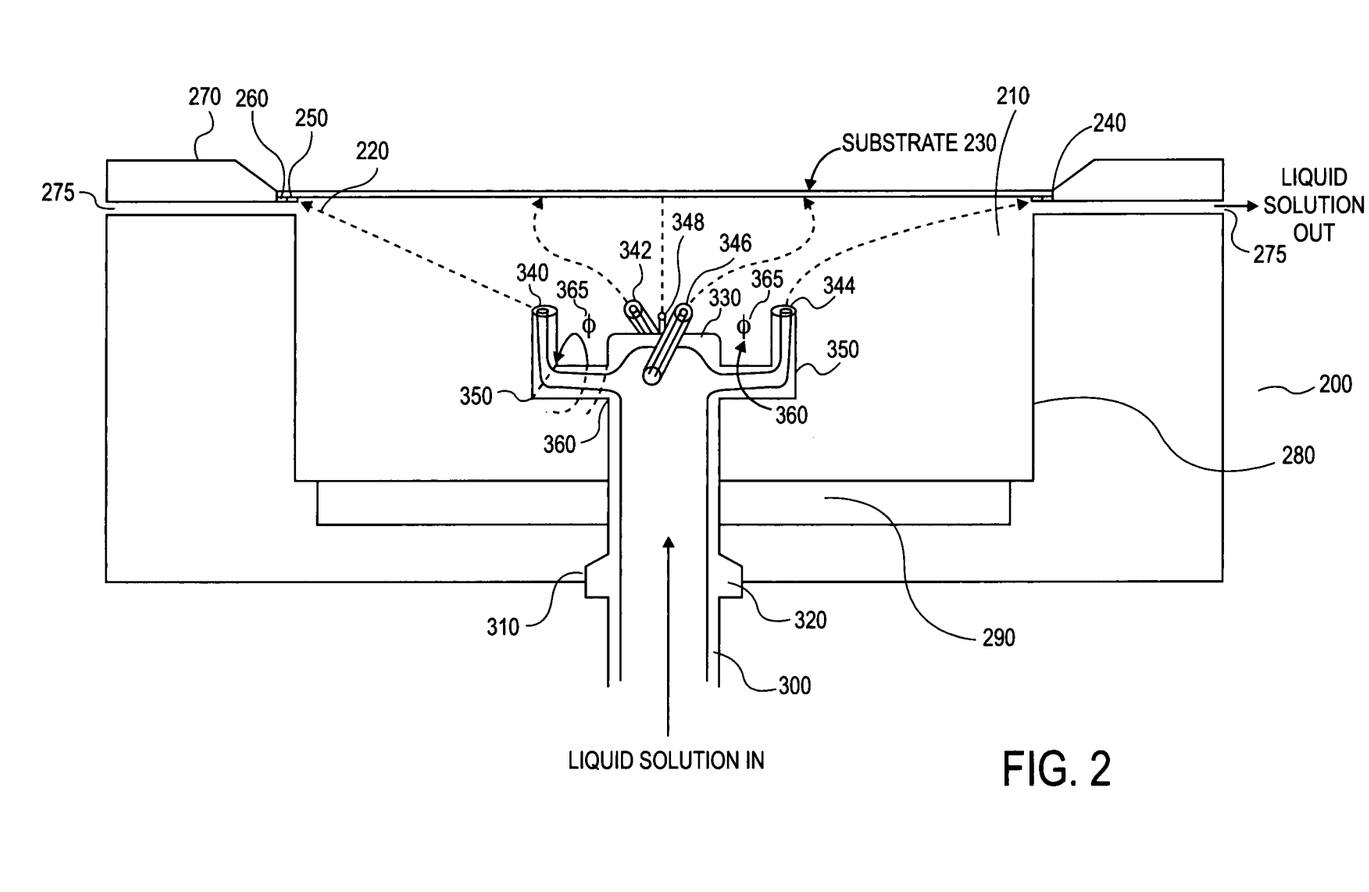
FIG. 2 is a cross-sectional view of an application of the present invention in an electrochemical cell.

Referring to FIG. 2, an application for the present invention is shown. An electrochemical cell 200 for electroplating a copper film on a semiconductor substrate 230 is provided in cross-sectional view. Electrochemical cell 200 includes a cup 210 inside which the electrochemical reactions occur. An opening 220 in the top end of cup 210 holds semiconductor substrate 230 face down on the rim 240 of cup 210. The surface of substrate 230 to be plated faces the interior of cup 210. An O-ring 250 provides a seal to prevent liquid from leaking out from the perimeter of substrate 230. Substrate 230 is in contact with a cathode 260, which in the present embodiment is preferably a continuous ring cathode. Cathode 260 is secured within rim 240 of cup 210 to prevent cathode 260 from moving about. Centering ring 270 positions substrate 230 in place. Exit slots 275 allow liquid solution to exit cup 210. Cylindrical walls 280 are electrically non-conductive. The anode 290 is coupled to positive terminal of power supply (not shown). Cathode 260 is coupled to the negative terminal of the power supply.

A pipe 300 is introduced through the bottom end of cup 210 through a hole 310. A gasket 320 forms a plug to prevent liquid from leaking down through the bottom of cup 210. Pipe 300 is capped on the pipe top end 330. Four spray outlets 340, 342, 344, 346 and a fifth spray outlet 348 extend outward from top end 330 to form a nozzle. Four spray outlets 340, 342, 344, 346 form elbow joints 350, and are twisted at their shoulder joints 360 to form a sideways angle ϕ365. Angle ϕ365 is preferably approximately 20 to 60 degrees from vertical. Fifth spray outlet 348 is shown as a straight extension outward from the center of pipe top end 330 so that liquid spray emanating therefrom is directed at an angle perpendicular to substrate surface 230 being held directly above. The purpose of fifth spray outlet 348 is to prevent a void from forming in the vortex of the electroplating liquid as it sprays against substrate 230 in a rotational flow manner. Spray outlets 340, 342, 344, 346 direct liquid at a sideways angle with respect to pipe 300. Alternatively, and not shown in FIG. 2, spray outlets 340, 342, 344, 346 may be angled radially outward from pipe 300. Liquid spray emanating from four spray outlets 340, 342, 344, 346, respectively, contacts substrate surface 230 at an angle to create a rotational liquid flow effect on substrate surface 230.

The electrochemical cell described in reference to FIG. 2 can be used to form a copper film on a silicon wafer. An electrical current applied to cathode 260 creates a current density of approximately 0.5 to 5 amps per square decimeter on substrate 230. Substrate 230 in this example is a silicon wafer of a diameter of 200 millimeters. Dimensions within the electrochemical cell depend on the shape and size of the substrate being treated. Substrate 230 is held at a distance of approximately 3 to 5 centimeters from the tips of spray outlets 340, 342, 344, 346. Cup 210 is approximately 190 millimeters in inner diameter and approximately 10 centimeters in depth. Inlet pipe 300 extends inward approximately 2 to 4 centimeters from the bottom of cup 210 interior. Liquid solution consisting of commercially available acid-copper plating bath is introduced to cup 210 at a flow rate of approximately 10 to 40 liters per minute. The liquid solution is directed at an angle ϕ365 of approximately 20 to 60 degrees away from vertical, to cause liquid to contact substrate 230 in a rotational direction. A copper film forms on substrate 230.

The embodiments of the present invention demonstrate the advantages of the invention in its simplicity for achieving an acceptably uniform coating on the surface of a substrate. Moving parts are not needed for directing the liquid spray, nor are there complex hole patterns in the anode. Note that the invention is not at all limited to electroplating, to a semiconductor substrate, or for that matter, to semiconductor processes. A person of ordinary skill in the art can experiment with angles, the number of spray outlets and other factors such as liquid flow rate and distance from the spray outlet to the substrate surface, to achieve the desired uniformity of thickness of material coated on the substrate. The nozzle may be different from that described here. For example, there could be a pipe inlet into the cup, where the pipe has a ribbon cutout instead of spray outlets. Nothing herein should be interpreted to be reducing the spirit or scope of the invention. To the extent details are described, such details are provided for facilitation of understanding the invention, the invention being limited only by the claims below.

I claim:

1. A method of applying a liquid material onto a substrate surface, comprising the steps of:
   placing the substrate surface within an enclosure;
   introducing the liquid material into the enclosure; and
   directing the liquid material angularly toward the substrate surface so that the liquid material flows rotationally upon contact with the substrate surface.

2. A method of applying a liquid material as in claim 1, further comprising the steps of:
   pressing the substrate against the enclosure to form a seal.

3. A method of applying a liquid material as in claim 1, further comprising the steps of:
   providing a cathode contact;
   coupling the cathode contact to the substrate surface;
   providing an anode coupled to the cathode; and
   wherein the liquid material is an electrolytic bath to form an electrochemical cell.

4. A method of applying a liquid material as in claim 3, further comprising the step of:
   forming a metallic film on the substrate surface.

5. A method of applying a liquid material as in claim 4, wherein the metallic film includes copper.

6. An apparatus for coating a substrate with a liquid material, comprising:
   a chamber having cylindrical interior walls, said chamber having a first end and an opposing second end;
   an opening in the first end for holding the substrate;
   an inlet pipe coupled to the second end, the inlet pipe having an end that is directed within the chamber;
   a nozzle coupled to the end of the inlet pipe, through which the liquid material is sprayed toward the substrate surface, wherein the liquid material flows rotationally upon contact with the substrate.

7. An apparatus for coating a substrate as in claim 6, wherein said nozzle further comprises a spray outlet having an elbow joint.

8. An apparatus for coating a substrate as in claim 6 wherein said liquid is sprayed out of said nozzle at an angle of approximately 20 to 60 degrees from vertical.

9. An apparatus for coating a substrate as in claim 8, wherein said liquid is directed toward the chamber interior walls.

10. An apparatus for coating a substrate as in claim 8, wherein said liquid is directed circumferentially with respect to the substrate surface.

11. A method of electroplating a material onto a substrate surface within an enclosed chamber, comprising:
    securing a substrate within an opening in a chamber so that a surface of the substrate faces an interior of the chamber;
    coupling a cathode to the substrate; and
    introducing an electrochemical liquid into the chamber through an outlet which, when viewed from the front, is off-center from a central axis of the substrate normal to the surface, and, when viewed from the right, is at an angle other than normal to the surface so that the liquid flows rotationally over the surface about the central axis, material plating out of the liquid onto the surface, wherein introducing a liquid further includes spraying the liquid out of a plurality of spray outlets at least two of the outlets contributing to said rotational flow about the axis over the surface, at least one of the plurality of spray outlets is pointed in a perpendicular direction toward the center of the substrate surface, and said plurality of spary outlets includes at least four spray outlets forming a cross pattern.

12. The method of claim 11, wherein said plurality of spary outlets further includes at least one spray outlet located at the center of the cross pattern.

13. The method of claim 11, wherein the spray outlets are angled at approximately 20 to 60 degrees relative to the surface.

14. The method of claim 13, wherein said liquid is directed radially outward with respect to the axis.

15. The method of claim 14, wherein said liquid has a circumferential component and a radial component relative to the axis.

* * * * *

UNITED STATES PATENT AND TRADEMARK OFFICE
CERTIFICATE OF CORRECTION

| | | |
|---|---|---|
| PATENT NO. | : 6,984,302 B2 | Page 1 of 4 |
| APPLICATION NO. | : 09/223472 | |
| DATED | : January 10, 2006 | |
| INVENTOR(S) | : Lee | |

It is certified that error appears in the above-identified patent and that said Letters Patent is hereby corrected as shown below:

Delete claims 1-15 and insert the following attached claims.

1. A method of applying a material onto a substrate surface, comprising:

exposing a surface of a substrate to a liquid, containing a material, in an enclosure; and directing more of the liquid from an outlet which, when viewed from the front, is off-center from a central axis of the substrate normal to the surface, and, when viewed from the right, is at an angle other than normal to the surface so that the liquid flows rotationally over the surface about the central axis, the material depositing on the surface, wherein introducing the liquid further includes spraying the liquids out of a plurality of spray outlets at least two of the outlets contributing to said rotational flow about the axis over the surface and the plurality of spray outlets includes at least four spray outlets forming a cross pattern.

2. The method of claim 1, further comprising:

pressing the substrate against the enclosure to form a seal.

3. The method of claim 1, further comprising:

coupling a cathode contact to the substrate surface, wherein the material plates onto the surface.

4. The method of claim 3, further comprising:

forming a metallic film on the substrate surface.

UNITED STATES PATENT AND TRADEMARK OFFICE
CERTIFICATE OF CORRECTION

PATENT NO. : 6,984,302 B2
APPLICATION NO. : 09/223472
DATED : January 10, 2006
INVENTOR(S) : Lee It is certified that error appears in the above-identified patent and that said Letters Patent is hereby corrected as shown below:

5. The method of claim 4, wherein the metallic film includes copper.

6. The method of claim 1, wherein the spray outlets are angled at approximately 20 to 60 degrees from the surface.

7. The method of claim 1, wherein the liquid is directed radially outward with respect to the center of the substrate surface.

8. The method of claim 1, wherein the liquid has a circumferential component and a radial component relative to the axis.

9. The method of claim 1, wherein at least one of the plurality of spray outlets is pointed in a perpendicular direction toward the center of the substrate surface.

10. The method of claim 1, wherein the plurality of spray outlets further includes at least one spray outlet located at the center of the cross pattern.

UNITED STATES PATENT AND TRADEMARK OFFICE
CERTIFICATE OF CORRECTION

PATENT NO. : 6,984,302 B2
APPLICATION NO. : 09/223472
DATED : January 10, 2006
INVENTOR(S) : Lee It is certified that error appears in the above-identified patent and that said Letters Patent is hereby corrected as shown below:

11. A method of electroplating a material onto a substrate surface within an enclosed chamber, comprising: securing a substrate within an opening in a chamber so that a surface of the substrate faces an interior of the chamber;

coupling a cathode to the substrate; and introducing an electrochemical liquid into the chamber through an outlet which, when viewed from the front, is off-center from a central axis of the substrate normal to the surface, and, when viewed from the right, is at an angle other than normal to the surface so that the liquid flows rotationally over the surface about the central axis, material plating out of the liquid onto the surface, wherein introducing a liquid further includes spraying the liquid out of a plurality of spray outlets at least two of the outlets contributing to said rotational flow about the axis over the surface, at least one of the plurality of spray outlets is pointed in a perpendicular direction toward the center of the substrate surface, and said plurality of spray outlets includes at least four spray outlets forming a cross pattern.

12. The method of claim 11, wherein said plurality of spray outlets further includes at least one spray outlet located at the center of the cross pattern.

13. The method of claim 11, wherein the spray outlets are angled at approximately 20 to 60 degrees relative to the surface.

UNITED STATES PATENT AND TRADEMARK OFFICE
CERTIFICATE OF CORRECTION

PATENT NO. : 6,984,302 B2
APPLICATION NO. : 09/223472
DATED : January 10, 2006
INVENTOR(S) : Lee

It is certified that error appears in the above-identified patent and that said Letters Patent is hereby corrected as shown below:

14. The method of claim 13, wherein said liquid is directed radially outward with respect to the axis.

15. The method of claim 14, wherein said liquid has a circumferential component and a radial component relative to the axis.

Signed and Sealed this

Fourth Day of March, 2008

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 6,984,302 B2 | Page 1 of 4 |
| APPLICATION NO. | : 09/223472 | |
| DATED | : January 10, 2006 | |
| INVENTOR(S) | : Lee | |

It is certified that error appears in the above-identified patent and that said Letters Patent is hereby corrected as shown below:

Column 5, delete lines 64 thru Column 8, line 3 (claims 1-15) and substitute the attached claims.

1. A method of applying a material onto a substrate surface, comprising:

exposing a surface of a substrate to a liquid, containing a material, in an enclosure; and directing more of the liquid from an outlet which, when viewed from the front, is off-center from a central axis of the substrate normal to the surface, and, when viewed from the right, is at an angle other than normal to the surface so that the liquid flows rotationally over the surface about the central axis, the material depositing on the surface, wherein introducing the liquid further includes spraying the liquids out of a plurality of spray outlets at least two of the outlets contributing to said rotational flow about the axis over the surface and the plurality of spray outlets includes at least four spray outlets forming a cross pattern.

2. The method of claim 1, further comprising:

pressing the substrate against the enclosure to form a seal.

3. The method of claim 1, further comprising:

coupling a cathode contact to the substrate surface, wherein the material plates onto the surface.

4. The method of claim 3, further comprising:

forming a metallic film on the substrate surface.

UNITED STATES PATENT AND TRADEMARK OFFICE
CERTIFICATE OF CORRECTION

| | |
|---|---|
| PATENT NO. | : 6,984,302 B2 |
| APPLICATION NO. | : 09/223472 |
| DATED | : January 10, 2006 |
| INVENTOR(S) | : Lee |

It is certified that error appears in the above-identified patent and that said Letters Patent is hereby corrected as shown below:

5. The method of claim 4, wherein the metallic film includes copper.

6. The method of claim 1, wherein the spray outlets are angled at approximately 20 to 60 degrees from the surface.

7. The method of claim 1, wherein the liquid is directed radially outward with respect to the center of the substrate surface.

8. The method of claim 1, wherein the liquid has a circumferential component and a radial component relative to the axis.

9. The method of claim 1, wherein at least one of the plurality of spray outlets is pointed in a perpendicular direction toward the center of the substrate surface.

10. The method of claim 1, wherein the plurality of spray outlets further includes at least one spray outlet located at the center of the cross pattern.

UNITED STATES PATENT AND TRADEMARK OFFICE
CERTIFICATE OF CORRECTION

| | |
|---|---|
| PATENT NO. | : 6,984,302 B2 |
| APPLICATION NO. | : 09/223472 |
| DATED | : January 10, 2006 |
| INVENTOR(S) | : Lee |

It is certified that error appears in the above-identified patent and that said Letters Patent is hereby corrected as shown below:

11. A method of electroplating a material onto a substrate surface within an enclosed chamber, comprising: securing a substrate within an opening in a chamber so that a surface of the substrate faces an interior of the chamber;

coupling a cathode to the substrate; and introducing an electrochemical liquid into the chamber through an outlet which, when viewed from the front, is off-center from a central axis of the substrate normal to the surface, and, when viewed from the right, is at an angle other than normal to the surface so that the liquid flows rotationally over the surface about the central axis, material plating out of the liquid onto the surface, wherein introducing a liquid further includes spraying the liquid out of a plurality of spray outlets at least two of the outlets contributing to said rotational flow about the axis over the surface, at least one of the plurality of spray outlets is pointed in a perpendicular direction toward the center of the substrate surface, and said plurality of spray outlets includes at least four spray outlets forming a cross pattern.

12. The method of claim 11, wherein said plurality of spray outlets further includes at least one spray outlet located at the center of the cross pattern.

13. The method of claim 11, wherein the spray outlets are angled at approximately 20 to 60 degrees relative to the surface.

UNITED STATES PATENT AND TRADEMARK OFFICE
CERTIFICATE OF CORRECTION

PATENT NO.        : 6,984,302 B2
APPLICATION NO. : 09/223472
DATED             : January 10, 2006
INVENTOR(S)       : Lee It is certified that error appears in the above-identified patent and that said Letters Patent is hereby corrected as shown below:

14.    The method of claim 13, wherein said liquid is directed radially outward with respect to the axis.

15.    The method of claim 14, wherein said liquid has a circumferential component and a radial component relative to the axis.

This certificate supersedes the Certificate of Correction issued March 4, 2008.

Signed and Sealed this

Twenty-fifth Day of March, 2008

JON W. DUDAS
*Director of the United States Patent and Trademark Office*